United States Patent [19]
Randall

[11] Patent Number: 5,618,383
[45] Date of Patent: Apr. 8, 1997

[54] NARROW LATERAL DIMENSIONED MICROELECTRONIC STRUCTURES AND METHOD OF FORMING THE SAME

[75] Inventor: John N. Randall, Richardson, Tex.

[73] Assignee: Texas Instruments Incorporated, Dallas, Tex.

[21] Appl. No.: 220,080

[22] Filed: Mar. 30, 1994

[51] Int. Cl.⁶ .................. H01L 21/312; H01L 21/302; H01L 21/465
[52] U.S. Cl. ............. 430/314; 430/329; 430/296; 438/947; 438/696; 438/669
[58] Field of Search .................. 437/228, 229, 437/225; 156/653, 661.1, 653.1, 661.11, 659.11, 657.1; 430/313, 314, 329

[56] References Cited

U.S. PATENT DOCUMENTS

| | | | |
|---|---|---|---|
| 4,209,349 | 6/1980 | Ho et al. | 148/187 |
| 4,256,514 | 3/1981 | Pogge | 148/1.5 |
| 4,358,340 | 11/1982 | Fu | 156/643 |
| 4,502,914 | 3/1985 | Trumpp et al. | 156/643 |
| 4,650,544 | 3/1987 | Erb et al. | 156/653 |
| 4,707,218 | 11/1989 | Giammarco et al. | 156/643 |
| 4,784,718 | 11/1988 | Mitani et al. | 156/653 |
| 4,803,181 | 2/1989 | Buchmann et al. | 437/228 |
| 4,931,137 | 6/1990 | Sibuet | 437/228 |

FOREIGN PATENT DOCUMENTS
59-163829A 9/1984 Japan.

*Primary Examiner*—Mark F. Huff
*Attorney, Agent, or Firm*—Richard Stoltz; Brian Carlson; Richard Donaldson

[57] ABSTRACT

In accordance with the present invention, there is provided a method by which narrow lateral dimensioned microelectronic structures can be formed using low temperature processes. An uncured resist layer (e.g. PMMA 42) is deposited on a supporting layer (e.g. silicon 40) and patterned. Then, by using an isotropic process such as a low temperature chemical vapor deposition, a conformal layer (e.g. silicon oxynitride 44) is deposited substantially evenly on the vertical walls and on the horizontal surfaces of the uncured resist layer. An anisotropic etch such as reactive ion etching is then used to substantially remove the conformal layer from the horizontal surfaces without substantially etching the conformal layer from the vertical walls of the resist. The resist can then be selectively removed, producing isolated vertical sidewall structures (e.g. silicon oxynitride 46) which could be used, for example, as a negative tone mask. Alternatively, instead of removing the resist, another resist layer (e.g. PMMA 48) could be spun on to planarize the structure, and then etched back to reveal the sidewall structures. The sidewall structures could then be selectively etched, producing a resist structure (e.g. PMMA 50) with openings the width of the sidewall structures.

40 Claims, 2 Drawing Sheets

NARROW LATERAL DIMENSIONED MICROELECTRONIC STRUCTURES AND METHOD OF FORMING THE SAME

The invention was made with government support under F08630-91-C-0012 awarded by the United States Air Force. The government has certain rights in this invention.

FIELD OF THE INVENTION

This invention generally relates to integrated circuits, and more particularly to narrow lateral dimensioned microelectronic structures formed using sidewall deposition techniques.

BACKGROUND OF THE INVENTION

During the past several years there has been a continuing trend toward the development of microelectronic devices having ever greater density. Scaling down device dimensions generally reduces the cost of manufacturing while increasing the device performance (e.g. speed). A number of methods are known to increase the integration density of integrated circuits. Specifically, considerable increases in integration density have been achieved by increasing photolithography resolution. Further progress has been made by using electron, X-ray and ion exposure methods instead of light radiation. However, high resolution lithography appears to be reaching a practical limit. For example, electron beam lithography is capable of producing line widths of about 10 nm to 15 nm, but generally cannot achieve higher resolution with useful resists. Although some experimentation has been done with Alkali-Halides in the sub-10 nm range, these inorganic resists are generally not suitable for pattern transfer. Organic resists, such as the high resolution resist polymethyl methacrylate (PMMA), appear to have a resolution limit of about 10 nm, possibly due to the range of low energy electrons generated in the resist. Accordingly, there is a continuing need for new techniques that are capable of providing higher resolutions and smaller device geometries beyond that offered by hitherto known methods.

SUMMARY OF THE INVENTION

Various attempts have been made in the prior art to create structures with dimensions smaller than those attainable with conventional lithographic techniques. One method of achieving this sub-lithographic resolution generally involves the use of anisotropic etching, such as reactive ion etching, wherein the vertical etching rate is much greater than the horizontal etching rate.

For example, U.S. Pat. No. 4,502,914 describes a method wherein structures of a polymeric material with horizontal and substantially vertical surfaces are first made on a substrate. Thereupon, a conformal silicon nitride or oxide layer is plasma deposited and subjected to reactive ion etching methods such that its horizontal regions are removed, and then the polymeric structures are removed, with merely the narrow regions of the silicon nitride or oxide layer, that has originally been arranged adjacent to the vertical surfaces of the polymeric structures, remaining. The vertical sidewall structures are then converted into a mask with the same dimensions but consisting of a different mask material.

In the process of U.S. Pat. No. 4,502,914, the silicon nitride or silicon dioxide layer is deposited on the polymeric material at about 210° C. (column 6, lines 19–32), which basically limits the polymeric material to polyimide or cured photoresist. This high temperature will not adversely affect polyimide or cured photoresist, but it will adversely affect uncured resist, since uncured resist will generally flow well below 210° C. (typically above 120° C. and generally above 130° C.) and degrade dimensional control. In addition, polyimide and cured photoresist are generally not easily dissolved by solvents, making removal by processes such as lift-off difficult or impossible with these materials.

As used herein, and when used in reference to lateral structural dimensions, the term "narrow" means a width of less than about 20 nm. When used in reference to the temperature of a process, the term "low" means a temperature of less than 130° C., and the term "high" means a temperature of greater than 130° C. When used in reference to resists, the term "uncured" means a resist layer that is soluble in an organic solvent during a semiconductor process step such as lift-off processing. An uncured resist will generally flow at high temperatures, resulting in decreased dimensional control. In contrast, a cured resist layer has generally been exposed to high temperature (typically 140° C.–160° C.) and ultraviolet light (typically after being patterned) to stabilize the resist, and hence will generally not flow during subsequent exposure to high temperatures. However, cured resist is generally difficult to remove with organic solvents. For practical removal with organic solvents such as in lift-off processing, the resist should preferably not be exposed to temperatures above 130° C.

In accordance with the present invention, there is provided a method by which narrow lateral dimensioned microelectronic structures can be formed using low temperature processes. An uncured resist layer is deposited on a supporting layer and patterned. Then, by using a low temperature isotropic process such as a low temperature chemical vapor deposition (CVD), a conformal layer is deposited substantially evenly on the vertical walls and on the horizontal surfaces of the uncured resist layer. The low temperature process inhibits the uncured resist layer from flowing subsequent to being patterned. The conformal layer material is chosen so as to have a high etch selectivity with respect to the uncured resist layer. An anisotropic etch such as reactive ion etching (RIE) is then used to substantially remove the conformal layer from the horizontal surfaces without substantially etching the conformal layer from the vertical walls of the resist. The resist can then be selectively removed, producing isolated vertical sidewall structures which could be used, for example, as a negative tone mask. Alternatively, instead of removing the resist, another resist layer could be spun on to planarize the structure, and then etched back to reveal the sidewall structures. The sidewall structures could then be selectively etched, producing a resist structure with openings the width of the sidewall structures. The low temperatures involved prevent substantial hardening of the resist layer throughout these processes.

One embodiment of this invention comprises a supporting layer and an uncured resist layer overlaying the supporting layer. The resist layer has openings with substantially vertical walls exposing portions of the supporting layer. Vertical sidewalls consisting of a material having substantial etch selectivity with respect to the resist layer are adjacent to and contacting the vertical walls. The vertical sidewalls have a width less than that obtainable by electron lithography.

One method of forming an embodiment of this invention comprises the steps of providing a supporting layer, depositing an uncured resist layer on the supporting layer, wherein the uncured resist layer is soluble in an organic solvent, and patterning the resist layer to form a profile having horizontal surfaces and vertical walls. A conformal layer is deposited at a first temperature on the horizontal surfaces and on the vertical walls. The conformal layer forms vertical sidewalls having a predetermined thickness on the vertical walls. The first temperature is below a second temperature which would adversely affect the uncured resist layer. The conformal layer is removed from the horizontal surfaces without substantially etching the vertical sidewalls by anisotropic etching. Narrow lateral dimensioned structures are formed on the supporting layer. The structures have lateral dimensions controlled by the thickness of the vertical sidewalls.

Another method of forming an embodiment of this invention comprises the steps of providing a supporting layer, depositing a first uncured resist layer on the supporting layer, and patterning the resist layer to expose a first portion of the supporting layer, thereby forming a profile having horizontal surfaces and vertical walls. A conformal layer is deposited at a first temperature of less than 130° C. on the horizontal surfaces and on the vertical walls. The conformal layer forms vertical sidewalls on the vertical walls, and the conformal layer has substantial etch selectivity with respect to the resist layer. The conformal layer is removed from the horizontal surfaces without substantially etching the vertical sidewalls by anisotropic etching. A second uncured resist layer is deposited on the horizontal surfaces and the vertical sidewalls thereby planarizing the profile. The first and second resist layers are etched to expose a top portion of the vertical sidewalls and form an uncured etched-back resist layer. The vertical sidewalls are removed to form openings in the etched-back resist layer exposing second portions of the supporting layer. The removal of the sidewalls is facilitated by the substantial etch selectivity of the sidewalls with respect to the uncured etched-back resist layer. The uncured etched-back resist layer is used as a mask to form the narrow lateral dimensioned structures on the supporting layer, and the mask is removed.

Yet another method of forming an embodiment of this invention comprises the steps of providing a supporting layer, depositing an uncured resist layer on the supporting layer, and patterning the resist layer to expose a portion of the supporting layer, thereby forming a profile having horizontal surfaces and vertical walls. A conformal layer is deposited at a first temperature of less than 130° C. on the horizontal surfaces and on the vertical walls. The conformal layer forms vertical sidewalls on the vertical walls, and the conformal layer has substantial etch selectivity with respect to the resist layer. The conformal layer is removed from the horizontal surfaces without substantially etching the vertical sidewalls by anisotropic etching. The uncured resist layer is removed, whereby the removal of the resist layer is facilitated by the resist layer remaining uncured after the low temperature deposition of the conformal layer.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

Figure 1:
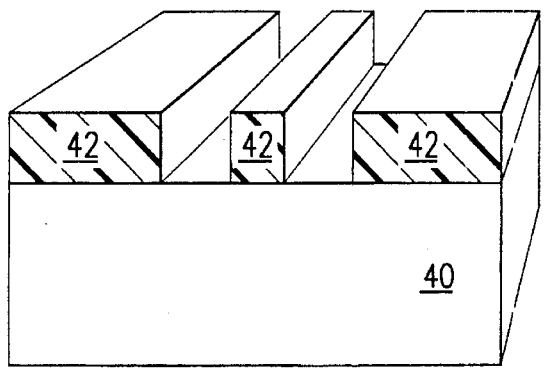
FIGS. 1–4 are cross-sectional views of the successive steps of a method for constructing a narrow lateral dimensioned mask structure on a supporting layer.

With reference to FIGS. 1–4, there is shown a method of forming a preferred embodiment of this invention, narrow lateral dimensioned microelectronic structures on a supporting layer. FIG. 1 illustrates a patterned layer of uncured PMMA resist 42 formed on the surface of a silicon substrate 40. Standard e-beam lithography (not shown) is used to expose and develop the predetermined pattern in the PMMA layer 42, since e-beam exposures of PMMA typically have very straight sidewalls.

Figure 2:
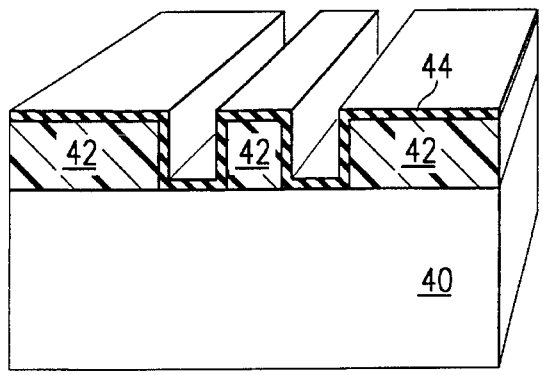

FIG. 2 illustrates the deposition of a conformal layer of silicon oxynitride 44 on the exposed vertical and horizontal surfaces of the PMMA layer 42 and silicon substrate 40. A low temperature (generally less than about 130° C., preferably less than about 120° C., more preferably less than about 100° C., still more preferably between about 85° C. and 95° C., and most preferably about 90° C.) plasma enhanced CVD process is used for this deposition, which is compatible with the PMMA layer 42 already on the substrate. This deposition is highly conformal, placing approximately the same thickness (preferably less than about 20 nm, more preferably less than 10 nm, and most preferably less than 5 nm) of material on the vertical and horizontal surfaces of the PMMA layer 42.

It should be noted that, in contrast to those prior art methods which attempt to merely narrow an existing opening by adding sidewalls, the openings in the PMMA layer 42 may or may not be at the lithographic resolution limit, since it is the width of the sidewalls themselves which is the controlling dimensional factor in the instant invention, and this width is generally independent of the width of the openings in the PMMA layer 42.

In addition, the present invention uses uncured resist, and generally avoids exposing the resist to high temperatures which could cure it before its removal. In the method of U.S. Pat. No. 4,502,914, sidewall structures of silicon dioxide or silicon nitride are made in a plasma deposition process that can be carried out at temperatures of greater than or equal to 200° C., and which represent a so-called low temperature process so that there is no damage of the polymeric structures. Although defined many times, the low temperature or cold processes of U.S. Pat. No. 4,502,914 are apparently between 200° C. and 300° C., and are far different (higher) than those of the present invention.

Figure 3:
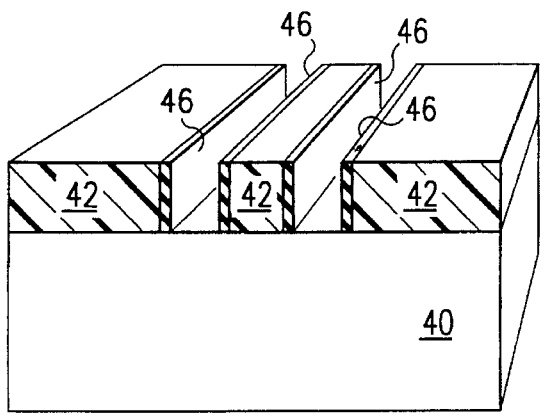
Figure 4:
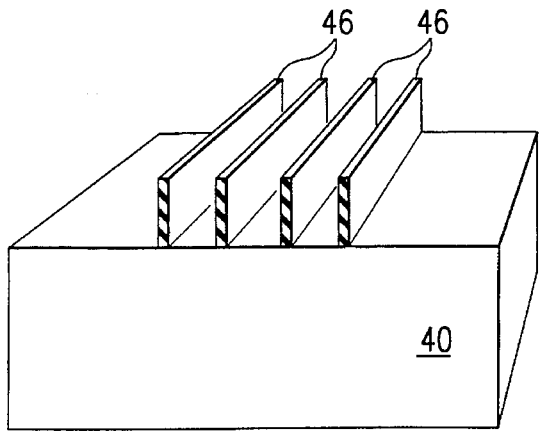

FIG. 3 illustrates the effect of anisotropic RIE, using $CF_4/O_2$ as the etch gases, of the conformal silicon nitride layer 44. The horizontal portions of the conformal layer are removed, while the vertical sidewalls 46 remain substantially unetched. The anisotropy (vertical to horizontal) is generally greater than about 2 to 1, preferably greater than about 5 to 1 and most preferably greater than about 10 to 1. FIG. 4 illustrates the selective removal of the PMMA layer 42 by an oxygen plasma, leaving the free standing silicon oxynitride sidewalls 46. These free standing structures can be used for example as a negative tone mask in subsequent process steps. Good two-way etch selectivity between the silicon oxynitride sidewalls 46 and the PMMA resist layer 42 is desirable, since each is etched in the presence of the other, and either the silicon oxynitride sidewalls 46 or the PMMA resist layer 42 can be used independently of the other in subsequent process steps.

Figure 5:
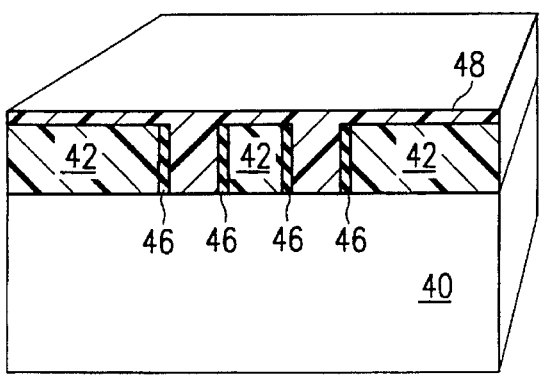
FIGS. 5–9 are cross-sectional views of the successive steps of a method for constructing narrow lateral dimensioned metallic structures on a supporting layer.
Figure 6:
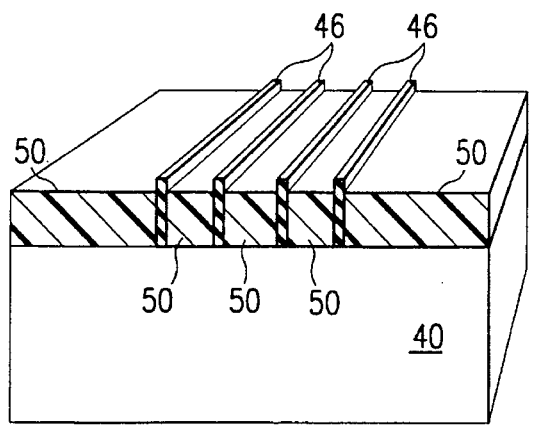
Figure 7:
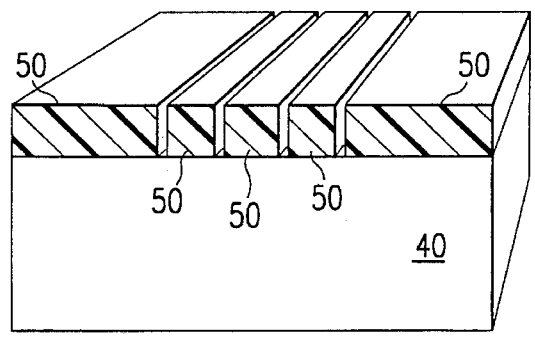

With reference to FIGS. 5–9, there is shown a method of forming another preferred embodiment of this invention. FIG. 5 illustrates the structure of FIG. 3 upon which a second PMMA resist layer 48 has been deposited in order to planarize the structure. As illustrated in FIG. 6, the PMMA resist layers 48, 42 are then etched back using an $O_2$ plasma or RIE to expose a portion of the silicon oxynitride sidewalls 46, and form an etched back resist layer 50. FIG. 7 illustrates the structure after a wet chemical etch such as buffered HF has been used to selectively remove the silicon oxynitride sidewalls 46. This results in a resist structure which has openings defined by the width of the now removed silicon oxynitride sidewalls 46.

Figure 8:
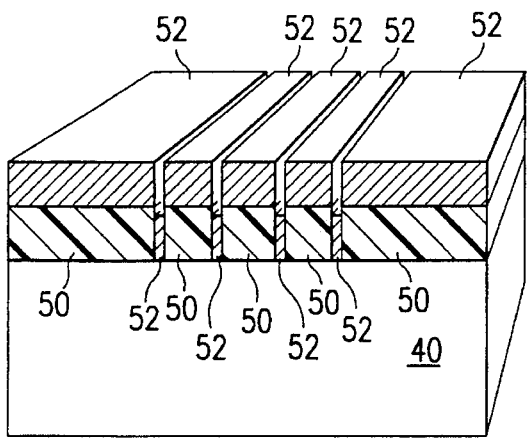
Figure 9:
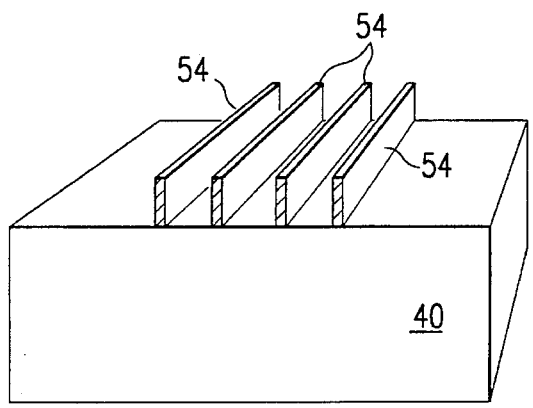

Referring to FIG. 8, an aluminum layer 52 has been deposited by vacuum evaporation onto the exposed portions of the silicon substrate 40 and the etched back resist layer 50. The resist layer 50 is then dissolved in acetone to lift-off the portions of the aluminum layer 52 which are overlaying the resist layer 50. This results in the structure illustrated in FIG. 9, a silicon substrate 40 with narrow lateral dimensioned aluminum lines 54 formed thereon. In one experiment, actual 15 nm aluminum lines have been formed by this process. In addition, free standing silicon oxynitride sidewalls less than 15 nm wide with approximately 40 nm center to center spacing have been formed.

The sole table, below, provides an overview of some embodiments and the drawings.

TABLE

| Drawing Element | Preferred or Specific Examples | Generic Term | Other Alternate Examples |
| --- | --- | --- | --- |
| 40 | Silicon | Supporting layer | Other semiconductor materials (e.g. gallium arsenide) Can be the substrate itself or a layer(s) on a substrate |
| 42, 48, 50 | PMMA | Uncured resist layer | Other high resolution resist materials (e.g. AZ5206) Combinations of above materials |
| 44 | Silicon oxynitride | Conformal layer | Other conformal materials (e.g. silicon dioxide, silicon nitride) |
| 46 | | Vertical sidewall | Combinations of above materials |
| 52 | Aluminum | Metallic layer | Other metals (e.g. gold, titanium, tungsten, platinum, silver, copper) |
| 54 | | Narrow lateral dimensioned patterned strucure | Metallic compounds/ mixtures (e.g. combinations of above metals: AlCu, TiW, Ti/Au, TiW/Au)) |

A few preferred embodiments have been described in detail hereinabove. It is to be understood that the scope of the invention also comprehends embodiments different from those described, yet within the scope of the claims. For example, the conformal layer has been described using silicon oxynitride as the preferred example, but silicon dioxide or silicon nitride may also be used for the conformal layer. As another example, masking layers have been used to produce negative tone images, but positive tone images may also be produced from these masks. A plasma enhanced CVD process was described for the conformal deposition process, but any process that deposits the desired material isotropically at a low temperature may be used. Likewise, another high selectivity anisotropic etching process may be used instead of RIE. The structures described can be formed directly on a semiconductor substrate or on intervening layers disposed on a substrate. The selection of material for the substrate or the metallic layer depends on the application; the assorted materials specified herein each have different properties which are useful in various methods or structures. With reference to the structures described, electrical connections to such structures can be ohmic, rectifying, capacitive, direct or indirect, via intervening circuits or otherwise. Implementation is contemplated in discrete components or fully integrated circuits in silicon, germanium, gallium arsenide, or other electronic materials families. In general the preferred or specific examples are preferred over the other alternate examples, and the other alternate examples are generally listed in order of preference.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming narrow lateral dimensioned microelectronic structures, said method comprising the steps of:

a. providing a semiconductor substrate;

b. depositing an uncured resist layer on said semiconductor substrate, wherein said uncured resist layer is soluble in an organic solvent;

c. patterning said resist layer to form a profile having horizontal surfaces and vertical walls;

d. depositing a conformal layer at a first temperature on said horizontal surfaces and on said vertical walls, said conformal layer forming vertical sidewalls having a first thickness on said vertical walls, wherein said conformal layer comprises silicon, and said first temperature is below a second temperature at which said uncured resist layer flows;

e. anisotropically etching to remove said conformal layer from said horizontal surfaces without substantially etching said vertical sidewalls; and f. removing said uncured resist layer to form said narrow lateral dimensioned structures on said semiconductor substrate, said structures having lateral dimensions controlled by said thickness of said vertical sidewalls.

2. The method according to claim 1, wherein said step of removing said uncured resist layer comprises lift-off.

3. The method according to claim 1, wherein said semiconductor substrate comprises silicon.

4. The method according to claim 1, wherein said uncured resist layer comprises polymethyl methacrylate.

5. The method according to claim 1, wherein said step of patterning said resist layer comprises electron beam lithography.

6. The method according to claim 1, wherein said step of depositing said conformal layer comprises plasma-enhanced chemical vapor deposition of said conformal layer.

7. The method according to claim 1, wherein said conformal layer is selected from the group consisting of: silicon oxynitride, silicon nitride, silicon dioxide, and combinations thereof.

8. The method according to claim 1, wherein said step of anisotropic etching comprises reactive ion etching of said conformal layer on said horizontal surfaces.

9. The method according to claim 8, wherein said reactive ion etching comprises using $CF_4/O_2$ etch gases to etch said conformal layer on said horizontal surfaces.

10. The method according to claim 1, wherein said first temperature is below 100° C.

11. The method according to claim 10, wherein said first temperature is between 85° C. and 95° C.

12. The method according to claim 1, wherein steps (b) through (f) are all performed below said second temperature.

13. The method according to claim 12, wherein said second temperature is 130° C.

14. The method according to claim 13, wherein said second temperature is 100° C.

15. The method according to claim 1, wherein said vertical sidewalls have a lateral thickness of less than about 20 nm.

16. The method according to claim 15, wherein said vertical sidewalls have a lateral thickness of less than about 10 nm.

17. The method according to claim 16, wherein said vertical sidewalls have a lateral thickness of less than about 5 nm.

18. A method of forming narrow lateral dimensioned microelectronic structures, said method comprising the steps of:
   a. providing a semiconductor substrate;
   b. depositing a first uncured resist layer on said semiconductor substrate, wherein said uncured resist layer is soluble in an organic solvent;
   c. patterning said resist layer to expose a first portion of an underlying layer, thereby forming a profile having horizontal surfaces and vertical walls;
   d. depositing a conformal layer at a first temperature of less than 130° C. on said horizontal surfaces and on said vertical walls, said conformal layer forming vertical sidewalls on said vertical walls, wherein said conformal layer comprises silicon, and said conformal layer has substantial etch selectivity with respect to said resist layer;
   e. anisotropically etching to remove said conformal layer from said horizontal surfaces without substantially etching said vertical sidewalls;
   f. depositing a second uncured resist layer on said horizontal surfaces and said vertical sidewalls thereby planarizing said profile;
   g. etching said first and second resist layers to expose a top portion of said vertical sidewalls and form an uncured etched-back resist layer;
   h. removing said vertical sidewalls to form openings in said etched-back resist layer exposing second portions of said underlying layer, whereby the removal of the sidewalls is facilitated by the substantial etch selectivity of the sidewalls with respect to the uncured etched-back resist layer;
   i. depositing a metallic layer on said etched-back resist layer and said exposed second portions of said underlying layer; and
   j. removing said etched-back resist layer.

19. The method according to claim 18, wherein said etched-back resist layer forms a negative tone image for said narrow lateral dimensioned structures.

20. The method according to claim 19, wherein said metallic layer is deposited using a vacuum evaporation process.

21. The method according to claim 19, wherein said step j further comprises dissolving said etched-back resist layer in acetone to lift-off said metallic layer on said etched-back resist layer.

22. The method according to claim 19, wherein said metallic layer is selected from the group consisting of: Al, Au, Ti, W, Pt, Ag, Cu, and combinations thereof.

23. The method according to claim 18, wherein said step of removing said vertical sidewalls comprises a wet chemical etch using buffered HF.

24. The method according to claim 18, wherein said step (j) comprises an oxygen plasma to lift-off said etched-back resist layer.

25. The method of claim 18, wherein said first and second resist layers are compatible with e-beam lithography.

26. A method of forming narrow lateral dimensioned microelectronic structures, said method comprising the steps of:
   a. providing a semiconductor substrate;
   b. depositing an uncured resist layer on said semiconductor substrate, wherein said uncured resist layer is soluble in an organic solvent;
   c. patterning said resist layer to expose a portion of said supporting layer, thereby forming a profile having horizontal surfaces and vertical walls;
   d. depositing a conformal layer at a first temperature of less than 130° C. on said horizontal surfaces and on said vertical walls, said conformal layer forming vertical sidewalls on said vertical walls, and said conformal layer having substantial etch selectivity with respect to said resist layer;
   e. anisotropically etching to remove said conformal layer from said horizontal surfaces without substantially etching said vertical sidewalls; and
   f. removing the uncured resist layer, whereby the removal of the resist layer is facilitated by the resist layer remaining uncured after the low temperature deposition of the conformal layer.

27. The method according to claim 26, said method further comprising using said vertical sidewalls as a negative tone mask after said step of removing said resist layer.

28. The method of claim 26, wherein said resist layer is compatible with e-beam lithography.

29. A narrow lateral dimensioned microelectronic structure comprising:
   a. a semiconductor substrate;
   b. an uncured resist layer overlying said semiconductor substrate, wherein said uncured resist layer is soluble in an organic solvent;
   c. openings in said resist layer exposing portions of an underlying layer, said openings having substantially vertical walls; and
   d. vertical sidewalls adjacent to and contacting said vertical walls, said sidewalls consisting of a material having substantial etch selectivity with respect to said resist layer, and said sidewalls having a width less than 20 nm.

30. The structure of claim 29, wherein said resist layer comprises polymethyl methacrylate.

31. The structure of claim 29, wherein said vertical sidewalls are selected from the group consisting of: silicon oxynitride, silicon nitride, silicon dioxide, and combinations thereof.

32. The structure of claim 31, wherein said openings are wider than said width of said vertical sidewalls.

33. The structure of claim 29, wherein said vertical sidewalls have a lateral thickness of less than about 10 nm.

34. The structure of claim 29, wherein said vertical sidewalls have a lateral thickness of less than about 5 nm.

35. The structure of claim 29, wherein said vertical sidewalls comprise a metal.

36. The structure of claim 35, wherein said vertical sidewalls are selected from the group consisting of: Al, Au, Ti, W, Pt, Ag, Cu, and combinations thereof.

37. The structure of claim 35, wherein said openings have said width of said vertical sidewalls.

38. The structure of claim 29, wherein said resist layer is compatible with e-beam lithography.

39. A microelectronic structure comprising:
  a. a semiconductor substrate;
  b. an uncured polymethyl methacrylate resist layer overlying said semiconductor substrate;
  c. openings in said resist layer exposing portions of an underlying layer, said openings having substantially vertical walls; and
  d. vertical sidewalls adjacent to and contacting said vertical walls, wherein said sidewalls have a width of less than 20 nm, wherein said openings are wider than said width of said sidewalls, and wherein said sidewalls are selected from the group consisting of: silicon oxynitride, silicon nitride, silicon dioxide, and combinations thereof.

40. A microelectronic structure comprising:
  a. a semiconductor substrate;
  b. an uncured polymethyl methacrylate resist layer overlying said semiconductor substrate;
  c. openings in said resist layer exposing portions of an underlying layer, said openings having substantially vertical walls; and
  d. vertical sidewalls adjacent to and contacting said vertical walls, wherein said sidewalls have a width of less than 20 nm, wherein said openings have said width of said sidewalls, and wherein said sidewalls are selected from the group consisting of: Al, Au, Ti, W, Pt, Ag, Cu, and combinations thereof.

* * * * *